United States Patent [19]

Dorri et al.

[11] Patent Number: 5,416,415

[45] Date of Patent: May 16, 1995

[54] OVER-SHOULDER MRI MAGNET FOR HUMAN BRAIN IMAGING

[75] Inventors: Bizhan Dorri, Clifton Park; Evangelos T. Laskaris, Schenectady; Michele D. Ogle, Burnt Hills, all of N.Y.

[73] Assignee: General Electric Company, Schenectady, N.Y.

[21] Appl. No.: 286,364

[22] Filed: Aug. 5, 1994

[51] Int. Cl.6 .............................................. G01V 3/00
[52] U.S. Cl. ...................................... 324/318; 324/319
[58] Field of Search ............... 324/318, 319, 320, 322; 128/653.5; 335/299, 300

[56] References Cited

U.S. PATENT DOCUMENTS

| | | | |
|---|---|---|---|
| 4,500,860 | 2/1985 | Vermilyea | 335/216 |
| 4,724,412 | 2/1988 | Kalafala | 335/299 |
| 4,924,198 | 5/1990 | Laskaris | 335/216 |
| 4,986,078 | 1/1991 | Laskaris | 62/51.1 |
| 5,307,039 | 4/1994 | Chari et al. | 324/318 |
| 5,311,134 | 5/1994 | Yamagata et al. | 128/653.5 |

OTHER PUBLICATIONS

U.S. patent application Ser. No. 08/260,433, filed Jun. 15, 1994, by E. T. Laskaris et al., "Open MRI Magnet with Superconductive Shielding".
U.S. patent application Ser. No. 08/237,516, filed Apr. 29, 1994, by E. T. Laskaris et al., "Pancake MRI Magnet with Modified Imaging Volume".
U.S. patent application Ser. No. 08/223,200, filed Apr. 5, 1994, by E. T. Laskaris et al., "Open MRI Magnet with Uniform Magnetic Field".
2-page Sales Brochure from Houston Advanced Researach Center entitled "MRI Magnets with Unprecedented Patient Access" (date unknown).

*Primary Examiner*—Louis Arana
*Attorney, Agent, or Firm*—Douglas E. Erickson; Paul R. Webb, II

[57] ABSTRACT

A magnetic resonance imaging (MRI) magnet having an annularly cylindrical-shaped vacuum enclosure with a longitudinal axis, first and second longitudinal ends, a first larger diameter bore extending from the first towards the second longitudinal end, and a second smaller diameter bore extending from the second longitudinal end to the first bore. First and second superconductive coils are placed in the vacuum enclosure with the first coil generally circumferentially surrounding the first bore and the second coil circumferentially surrounding the second bore, wherein the radial distance of the radially innermost portion of the second coil from the axis is smaller than the radius of the first bore. The first longitudinal end of the vacuum enclosure fits over a patient's shoulders with the patient's head at least partially passing through the first bore and extending into the second bore for MRI brain imaging.

11 Claims, 2 Drawing Sheets

OVER-SHOULDER MRI MAGNET FOR HUMAN BRAIN IMAGING

BACKGROUND OF THE INVENTION

The present invention relates generally to a superconductive magnet used to generate a high magnetic field as part of a magnetic resonance imaging (MRI) diagnostic system, and more particularly to such a magnet having a compact design for inexpensively imaging specific parts of the human body, such as the brain.

MRI systems employing superconductive magnets are used in various fields such as medical diagnostics. Known superconductive magnets include liquid-helium cooled and cryocooler-cooled superconductive magnets. Typically, for a cryocooler-cooled magnet, the superconductive coil assembly includes a superconductive main coil surrounded by a thermal shield surrounded by a vacuum enclosure. A cryocooler coldhead is externally mounted to the vacuum enclosure, has its first stage in thermal contact with the thermal shield, and has its second stage in thermal contact with the superconductive main coil.

Superconductive magnets have been mentioned in a sales brochure which claim a helmet design (with eye opening) for MRI brain imaging within a 10 centimeter-diameter spherical imaging volume of 2 Tesla having a pre-shim inhomogeneity of 10 parts per million (ppm) and a bore diameter of 20 centimeters. However, such designs have not been disclosed.

Known superconductive magnets include those having a large, tubular-shaped superconductive coil assembly with one or more longitudinally spaced-apart main coils carrying an equal electric current in a first direction for generating a high magnetic field within the spherical imaging volume of the magnet's bore. Such whole-body magnets provide an expensive way for MRI imaging of the brain.

What is needed is a relatively inexpensive superconductive magnet designed for high magnetic field MRI imaging of the human brain.

SUMMARY OF THE INVENTION

It is an object of the invention to provide a superconductive MRI magnet having a high magnetic field and a compact design for imaging the human brain.

The magnetic resonance imaging (MRI) magnet of the invention includes a generally annularly cylindrical-shaped vacuum enclosure, at least two superconductive coils, and a gradient coil. The vacuum enclosure has a generally longitudinally extending axis, first and second longitudinal ends, a first bore, and a second bore. The first bore is generally coaxially aligned with the axis, extends with a generally constant radius from the first longitudinal end towards the second longitudinal end, and is spaced apart from the second longitudinal end. The second bore is generally coaxially aligned with the axis and extends with a generally constant radius from the second longitudinal end to the first bore, with the radius of the second bore being smaller than the radius of the first bore. The superconductive coils are longitudinally spaced apart, generally coaxially aligned with the axis, and positioned within and spaced apart from the vacuum enclosure. The superconductive coils include a first coil and a second coil each carrying an electric current in generally the same direction. The first coil generally circumferentially surrounds the first bore, and the second coil generally circumferentially surrounds the second bore. The second coil has a radially innermost portion, with the radial distance of the radially innermost portion of the second coil from the axis being smaller than the radius of the first bore. The gradient coil is positioned generally in the second bore.

In a preferred embodiment, the superconductive coils generate a magnetic resonance imaging volume having a shape of generally a sphere.

Several benefits and advantages are derived from the invention. Applicants' radially inward positioning of a superconductive coil and spherical shaping of the imaging volume provide a compact MRI magnet design of high magnetic field strength for medical imaging of the human brain when the first longitudinal end of the vacuum enclosure is fitted over a patient's shoulders with the patient's head at least partially passing through the first bore and extending into the second bore.

BRIEF DESCRIPTION OF THE DRAWINGS

The accompanying drawings illustrate two preferred embodiments of the present invention wherein.

DETAILED DESCRIPTION OF THE INVENTION

Figure 1:
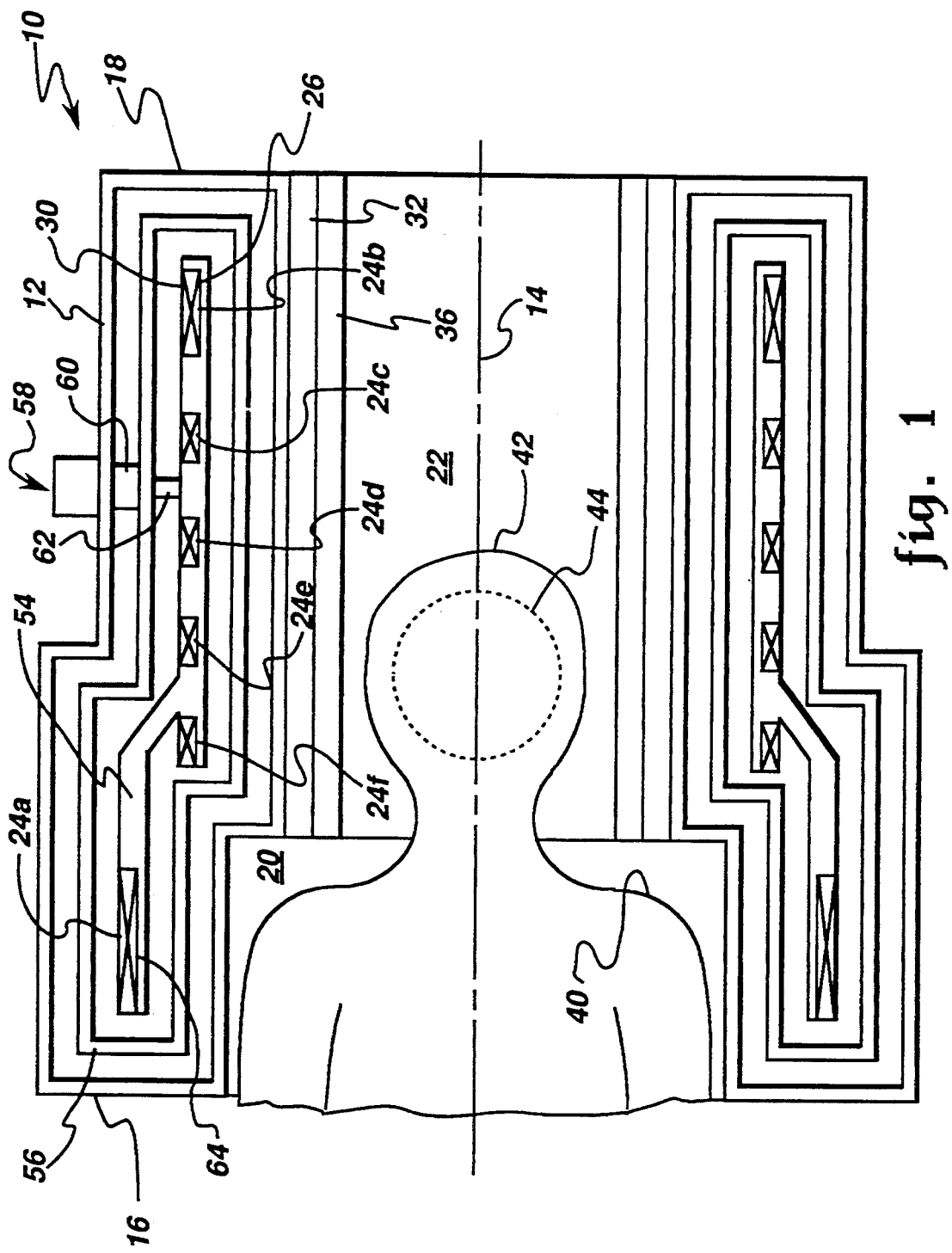
FIG. 1 is a schematic cross-sectional top-planar view of a first preferred embodiment of an MRI magnet of the invention with hatching lines omitted for clarity.

Referring now to the drawing, FIG. 1 shows a first preferred embodiment of the magnetic resonance imaging (MRI) magnet 10 of the present invention. The magnet 10 includes a generally annularly cylindrical-shaped vacuum enclosure 12 having a generally longitudinally extending axis 14, first and second longitudinal ends 16 and 18, a first bore 20, and a second bore 22. The first bore 20 is generally coaxially aligned with the axis 14, extends with a generally constant radius from the first longitudinal end 16 towards the second longitudinal end 18, and is spaced apart from the second longitudinal end 18. The second bore 22 is generally coaxially aligned with the axis 14 and extends with a generally constant radius from the second longitudinal end 18 to the first bore 20, with the radius of the second bore 22 being smaller than the radius of the first bore 20. In an exemplary embodiment, the longitudinal distance the first bore 20 extends from the first longitudinal end 16 does not exceed the longitudinal distance separating the first bore 20 from the second longitudinal end 18. For a generally 0.5 Tesla magnet 10, preferably the longitudinal distance the first bore 20 extends from the first longitudinal end 16 also is smaller than the longitudinal distance separating the first bore 20 from the second longitudinal end 18.

The magnet 10 also includes a plurality of longitudinally spaced-apart superconductive coils 24a to 24f generally coaxially aligned with the axis 14 and disposed within and spaced apart from the vacuum enclosure 12. The superconductive coils 24a to 24f, including a first coil 24a and a second coil 24b, each carry an electric current in generally the same direction (which is either a clockwise or a counterclockwise circumferential direction about the axis 14 with any slight longitudinal component of current direction being ignored). The first coil 24a generally circumferentially surrounds the first bore 20, and the second coil 24b generally circumferentially surrounds the second bore 22. The second coil 24b has a radially innermost portion 26,, wherein the radial distance of the radially innermost portion 26 of the second coil 24b from the axis 14 is smaller than the radius of the first bore 20.

In an exemplary embodiment, the first coil 24a is disposed closer to the first longitudinal end 16 than to the second longitudinal end 18, and the second coil 24b is disposed closer to the second longitudinal end 18 than to the first longitudinal end 16. Preferably, the first coil 24a is disposed generally proximate the first longitudinal end 16, and the second coil 24b is disposed generally proximate the second longitudinal end 18. In a preferred embodiment, the first and second coils 24a and 24b each extend a longitudinal length and a radial length, wherein the longitudinal length of the first coil 24a is greater than the radial length of the first coil 24a, and wherein the longitudinal length of the second coil 24b is greater than the radial length of the second coil 24b. In a favored embodiment, the second coil 24b has a radially outermost portion 30, wherein the radial distance of the radially outermost portion 30 of the second coil 24b from the axis 14 is smaller than the radius of the first bore 20.

The magnet 10 further includes a gradient coil 32 disposed generally in the second bore 22. Preferably, the magnet 10 additionally includes a radio-frequency coil 36 disposed generally in the second bore 22 radially inward of the gradient coil 32. Preferably, for a generally 0.5 Tesla magnet 10, neither the gradient coil 32 nor the radio-frequency coil 36 extends into the first bore 20. It is noted that in FIG. 1, the gradient coil 32 is schematically shown as contacting the vacuum enclosure 12 and the radio-frequency coil 36 is schematically shown as contacting the gradient coil 32. However, as is known to those skilled in the art, an MRI magnet typically may also include passive shims, a gradient shield, and a gap between the vacuum enclosure 12 and the gradient coil 32, and typically may also include a radio-frequency shield and a gap between the gradient coil 32 and the radio-frequency coil 36 (such shims, shields, and gaps not shown in the figures for clarity). It is mentioned that the gradient shield may be omitted if continuous metallic paths are avoided on and within the vacuum enclosure 12 for an eddy-current-free magnet 10.

Although the magnet 10 may be used to image various parts of the human body, such as limbs, the magnet 10 preferably is designed specifically for high magnetic field MRI imaging of the human brain. Thus, the first and second bores 20 and 22 preferably are sized such that the first longitudinal end 16 fits over a patient's shoulders 40 with the patient's head 42 at least partially passing through the first bore 20 and extending into the second bore 22 and such that the second bore 22 has a diameter which is smaller than the width of the patient's shoulders 40. It is noted that the term "patient" means an average-sized human adult patient with such size averaged over males and females, as can be determined by those skilled in the art. Preferably, for a generally 0.5 Tesla magnet 10, the patient's head 42 passes through the first bore 20. Using the principles of the present invention, previously described herein, together with conventional magnetic field analysis, as is within the skill of the artisan, the superconductive coils 24a to 24f preferably are designed to generate a magnetic resonance imaging volume 44 (shown in dotted line) in the region of the patient's brain when the first longitudinal end 16 of the vacuum enclosure 12 is fitted over (i.e., surrounds and extends below) the patient's shoulders 40 with the patient's head 42 at least partially passing through the first bore 20 and extending into the second bore 22. Preferably, the superconductive coils 24a to 24f are designed to generate a magnetic resonance imaging volume 44 which has a shape of generally a sphere having a center disposed in the second bore 22 and generally on the axis 14, and wherein such center is further disposed generally longitudinally equidistant from the first and second longitudinal ends 16 and 18 of the vacuum enclosure 12. In an exemplary embodiment, for a 0.5 Tesla magnet 10, the entire spherical imaging volume 44 is disposed in the second bore 22.

Using the principles of the present invention, previously described herein, together with conventional magnetic field analysis, as is within the skill of the artisan, Applicants designed (but have yet to build) such a magnet 10 having a generally 0.5 Tesla magnetic field within a generally 18-centimeter diameter spherical imaging volume 44 having a design peak-to-peak magnetic field inhomogeneity of less than 10 parts-per-million (ppm). The first bore 20 was designed to have a diameter of generally 53 centimeters, the second bore 22 was designed to have a diameter of generally 35 centimeters, and the radio-frequency coil 36 was designed to have an inside diameter of generally 25 centimeters. The vacuum enclosure 12 had a longitudinal length of generally 62 centimeters, and the center of the spherical imaging volume 44 was positioned generally 32 centimeters from the first longitudinal end 16 of the vacuum enclosure 12. It is noted that the patient does not contact the vacuum enclosure 12.

In Applicants' magnet design, the superconductive coils 24a to 24f comprised a continuous (integral or spliced) length of generally 0.12-inch wide and generally 0.01-inch thick Nb-Sn superconductive tape kept at a temperature of generally 10 Kelvin and carrying an electric current having an amperage of generally 214 amperes. The first coil 24a is longitudinally located generally 2 centimeters from the first longitudinal end 16 of the vacuum enclosure 12, is radially located generally 28 centimeters from the axis 14, extends a longitudinal length of generally 10 centimeters, extends a radial length of generally 1 centimeter, and has generally 470 meters of superconductive tape. The second coil 24b is longitudinally located generally 2 centimeters from the second longitudinal end 18 of the vacuum enclosure 12, is radially located generally 19 centimeters from the axis 14, extends a longitudinal length of generally 6 centimeters, extends a radial length of generally 1 centimeter, and has generally 360 meters of superconductive tape. The third coil 24c is longitudinally located generally 8 centimeters from the second coil 24b, is radially located generally 19 centimeters from the axis 14, extends a longitudinal length of generally 4 centimeters, extends a radial length of generally 0.5 centimeters, and has generally 134 meters of superconductive tape. The fourth coil 24d is longitudinally located generally 4 centimeters from the third coil 24c, is radially located generally 20 centimeters from the axis 14, extends a longitudinal length of generally 3 centimeters, extends a radial length of generally 0.5 centimeters, and has generally 94 meters of superconductive tape. The fifth coil 24e is longitudinally located generally 3 centimeters from the fourth coil 24d, is radially located generally 20 centimeters from the axis 14, extends a longitudinal length of generally 3 centimeters, extends a radial length of generally 0.5 centimeters, and has generally 81 meters of superconductive tape. The sixth coil 24f is longitudinally located generally 4 centimeters from the fifth coil 24e and generally 10 centimeters from the first coil 24a, is radially located generally 20 centimeters from the axis 14, extends a longitudinal length of generally 3 centimeters, extends a radial length of generally 0.5 centimeters, and has generally 78 meters of superconductive tape. Preferably, the magnet 10 includes a coil form 54 supporting the superconductive coils 24a to 24f.

In an exemplary embodiment, the magnet 10 includes a thermal shield 56 disposed within and spaced apart from the vacuum enclosure 12, wherein the superconductive coils 24a to 24f are disposed within and spaced apart from the thermal shield 56. Conventional spacers (omitted from the figures for clarity) space and support the coil form 54 from the thermal shield 56 and the thermal shield 56 from the vacuum enclosure 12. Preferably, the magnet 10 is provided with a cryocooler coldhead 58 (such as a cryocooler coldhead of a Gifford-McMahon cryocooler) having a first stage 60 and a second stage 62, wherein the second stage 62 (which has a temperature of generally 10 Kelvin) is colder than the first stage 60 (which has a temperature of generally 40 Kelvin). As seen from FIG. 1, the second stage 62 is in thermal contact with the superconductive coils 24a to 24f (by being in thermal contact with the coil form 54), and the first stage 60 is in thermal contact with the thermal shield 56. In a first preferred construction, the coil form 54 comprises a glass reinforced epoxy composite wrapped with copper (or some other high thermal conductivity material), the thermal shield 56 comprises copper (or some other high thermal conductivity material), and the vacuum enclosure 12 comprises a metal such as stainless steel. In a second preferred construction, the coil form 54 and the thermal shield 56 each comprise a glass reinforced epoxy composite having copper (or some other high thermal conductivity material) wires or strips, and the vacuum enclosure 12 comprises a glass reinforced epoxy composite having some vapor barrier structure (such as stainless steel foils) embedded in it. In a third preferred construction, the vacuum enclosure 12 comprises iron or any other magnetically shielding material to provide partial or complete shielding of the magnet's stray field. Such shielding makes the magnet 10 easier to site in a hospital room containing electronic equipment whose proper operation would be compromised by the magnet's stray field.

Figure 2:
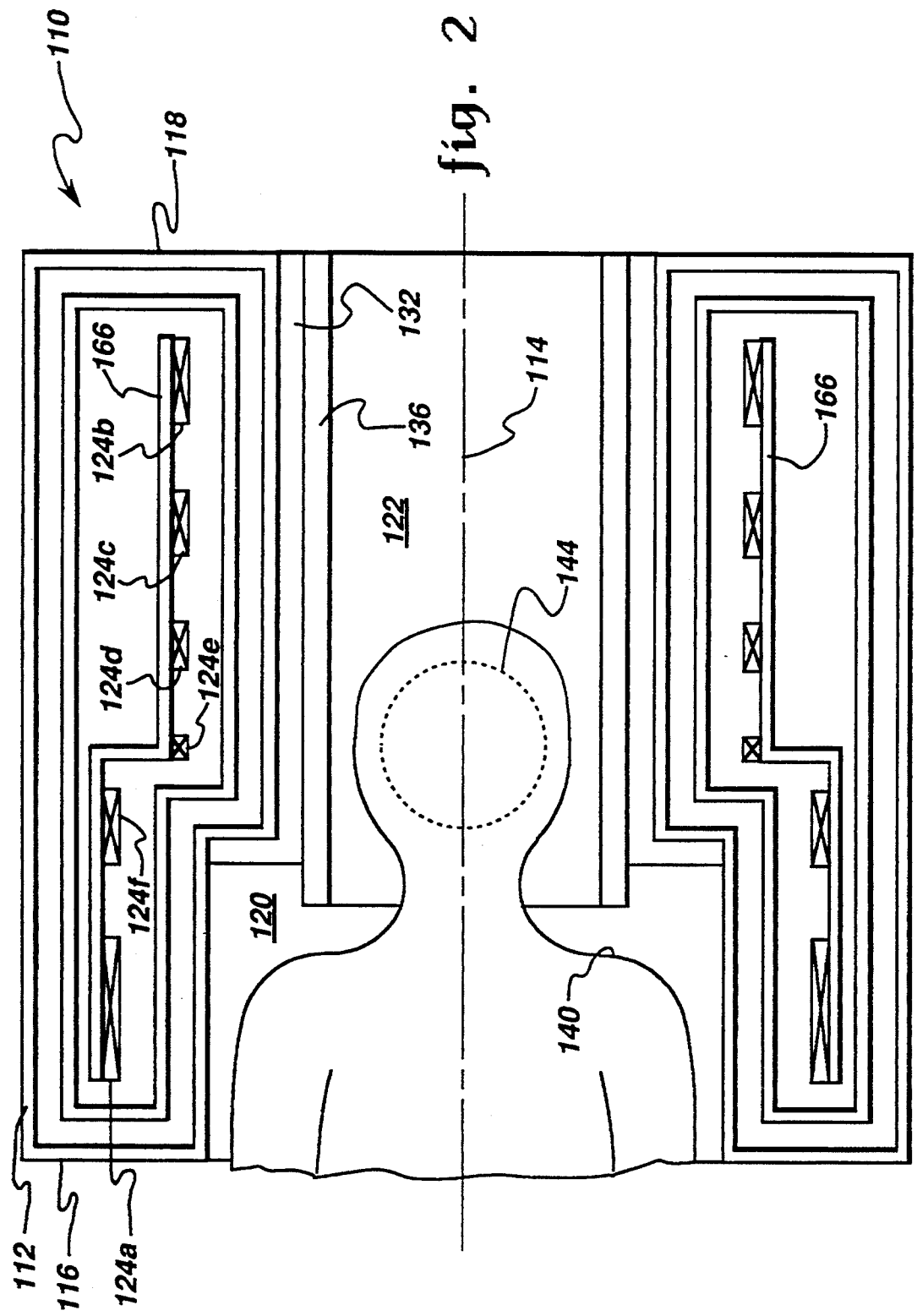
FIG. 2 is a schematic cross-sectional top-planar view of a second preferred embodiment of an MRI magnet of the invention with hatching lines and magnet cooling omitted for clarity, wherein the second preferred embodiment has a higher magnetic field than the first preferred embodiment.

Referring again to the drawing, FIG. 2 shows a second preferred embodiment of the magnetic resonance imaging (MRI) magnet 110 of the present invention. Magnet 110 of FIG. 2 is similar to magnet 10 of FIG. 1. Applicants designed (but have yet to build) such a magnet 110 having a generally 4.0 Tesla magnetic field within a generally 18-centimeter diameter spherical imaging volume 144 having a design peak-to-peak magnetic field inhomogeneity of less than 1 part-per-million (ppm). The first bore 120 was designed to have a diameter of generally 57 centimeters, the second bore 122 was designed to have a diameter of generally 38 centimeters, and the radio-frequency coil 136 was designed to have an inside diameter of generally 28 centimeters. The vacuum enclosure 112 had a longitudinal length of generally 86 centimeters, and the center of the spherical imaging volume 144 was positioned generally 47 centimeters from the first longitudinal end 116 of the vacuum enclosure 112. The superconductive coils 124a to 124f comprise self-standing Nb-Ti superconductive coils operating at a temperature of generally 4 Kelvin with such coils 124a to 124f surrounded by an aluminum structure 166 for magnetic force containment. The gradient coil 132, the radio-frequency coil 136, and the imaging volume 144 are seen to extend into the first bore 120.

It is noted (but not shown in FIG. 2) that a preferred mode of cooling a 4.0 Tesla magnet is to use: a liquid-helium dewar disposed outside, and hermetically connected to, the magnet; a thermal busbar having a first end disposed in the liquid helium and a second end in thermal contact with the superconductive coils; and a cryocooler coldhead mounted to the dewar with a cold stage extending downward to a point which is above and proximate the liquid helium to recondense liquid helium that was boiled-off in cooling the magnet.

The compact design of the over-shoulder brain imaging MRI magnet 10 (or 110) of the invention achieves high magnetic field strength with low design magnetic field inhomogeneity by coil positioning. Low magnetic field inhomogeneity requires a large solid angle between a plane, passing through the center of the imaging volume 44 (or 144) perpendicular to the axis 14 (or 114), and each of the first and second coils 24a and 24b (or 124a and 124b). This is achieved, in part, by longitudinally positioning the first coil 24a (or 124a) proximate the first longitudinal end 16 (or 116) of the vacuum enclosure 12 (or 112) and the second coil 24b (or 124b) proximate the second longitudinal end 18 (or 118) of the vacuum enclosure 12 (or 112) with the first coil 24a (or 124a) surrounding and extending below the patient's shoulders 40 (or 140). Such design techniques result in an MRI magnet 10 (or 110) with a high magnetic field strength for better MRI imaging. It is noted that preferably the patient is in a supine position on a medical examining table (not shown in the figures) which is brought to the MRI magnet 10 (or 110) to have the first longitudinal end 16 (or 116) of the vacuum enclosure 12 (or 112) be fitted over the patient's shoulders 40 (or 140).

The foregoing description of two preferred embodiments of the invention has been presented for purposes of illustration. It is not intended to be exhaustive or to limit the invention to the precise forms disclosed, and obviously many modifications and variations are possible in light of the above teaching. For example, the superconductive coils 24a to 24f (or 124a to 124f) of the magnet 10 (or 110) of the invention are not limited to being cryocooler-cooled, and may be liquid-helium (or other liquid-cryogen) cooled. It is intended that the scope of the invention be defined by the claims appended hereto.

We claim:

1. A magnetic resonance imaging magnet comprising:
   a) a generally annularly cylindrical-shaped vacuum enclosure having:
      (1) a generally longitudinally extending axis,
      (2) first and second longitudinal ends,
      (3) a first bore generally coaxially aligned with said axis, extending with a generally constant radius from said first longitudinal end towards said second longitudinal end, and spaced apart from said second longitudinal end, and (4) a second bore generally coaxially aligned with said axis and extending with a generally constant radius from said second longitudinal end to said first bore, wherein said radius of said second bore is smaller than said radius of said first bore;

b) a plurality of longitudinally spaced-apart superconductive coils generally coaxially aligned with said axis and disposed within and spaced apart from said vacuum enclosure, said superconductive coils including a first coil and a second coil each carrying an electric current in generally the same direction, said first coil generally circumferentially surrounding said first bore and said second coil generally circumferentially surrounding said second bore, said second coil having a radially innermost portion, and wherein the radial distance of said radially innermost portion of said second coil from said axis is smaller than said radius of said first bore; and c) a gradient coil disposed generally in said second bore.

2. The magnet of claim 1, also including a radio-frequency coil disposed generally in said second bore radially inward of said gradient coil.

3. The magnet of claim 1, wherein said first coil is disposed proximate said first longitudinal end, and said second coil is disposed proximate said second longitudinal end.

4. The magnet of claim 3, wherein said first and second coils each extend a longitudinal length and a radial length, wherein said longitudinal length of said first coil is greater than said radial length of said first coil, and wherein said longitudinal length of said second coil is greater than said radial length of said second coil.

5. The magnet of claim 4, wherein said second coil has a radially outermost portion, and wherein the radial distance of said radially outermost portion of said second coil from said axis is smaller than said radius of said first bore.

6. The magnet of claim 1, wherein said first and second bores are sized such that said first longitudinal end fits over a patient's shoulders with the patient's head at least partially passing through said first bore and extending into said second bore and such that said second bore has a diameter which is smaller than the width of the patient's shoulders.

7. The magnet of claim 6, wherein said superconductive coils generate a magnetic resonance imaging volume in the region of the patient's brain when the first longitudinal end is fitted over the patient's shoulders with the patient's head at least partially passing through said first bore and extending into said second bore.

8. The magnet of claim 7, wherein said imaging volume has a shape of generally a sphere having a center disposed in said second bore and generally on said axis.

9. The magnet of claim 8, wherein said center is disposed generally longitudinally equidistant from said first and second longitudinal ends.

10. The magnet of claim 1, also including a thermal shield disposed within and spaced apart from said vacuum enclosure, wherein said superconductive coils are disposed within and spaced apart from said thermal shield, and further including a cryocooler coldhead having a first stage and a second stage, wherein said second stage is colder than said first stage, wherein said second stage is in thermal contact with said superconductive coils, and wherein said first stage is in thermal contact with said thermal shield.

11. The magnet of claim 1, wherein said first bore has a diameter of generally 53 centimeters, said second bore has a diameter of generally 35 centimeters.

* * * * *